United States Patent [19]

Noma

[11] Patent Number: 5,172,116

[45] Date of Patent: Dec. 15, 1992

[54] A/D CONVERSION APPARATUS

[75] Inventor: Toshihiro Noma, Tokyo, Japan

[73] Assignee: NEC Corporation, Tokyo, Japan

[21] Appl. No.: 738,227

[22] Filed: Jul. 30, 1991

[30] Foreign Application Priority Data

Jul. 31, 1990 [JP] Japan .................. 2-203315

[51] Int. Cl.$^5$ .............................................. H03M 1/12
[52] U.S. Cl. ...................................... 341/141; 341/155
[58] Field of Search ........................ 341/141, 155; 364/942.03, 140, 143, 221.5, 238

[56] References Cited

U.S. PATENT DOCUMENTS

| | | | |
|---|---|---|---|
| 4,016,557 | 4/1977 | Zitelli et al. ............ | 341/141 X |
| 4,050,062 | 9/1977 | Crocker et al. ......... | 341/141 X |
| 4,062,005 | 12/1977 | Freed et al. ............ | 341/141 X |
| 4,654,632 | 3/1987 | Yoshida et al. ......... | 341/141 |
| 4,933,676 | 6/1990 | Hauge et al. ........... | 341/141 |
| 4,965,577 | 10/1990 | Baba ....................... | 341/141 |
| 5,043,911 | 8/1991 | Rashid .................... | 364/494 |

Primary Examiner—Sharon D. Logan

[57] ABSTRACT

An A/D conversion apparatus includes an analog input selecting device, and A/D converter and an operation control device. The operation control unit issues an input terminal designating signal to the analog input selecting device in accordance with an optionally designated A/D conversion order. Then, the analog input selecting device successively selects the analog input terminals in the designated order. The A/D converter A/D-converts the analog signals from the input terminals selected into digital values. In this way, the A/D conversion for the analog signals can be made in any priority, or the order of scanning the input terminals can be optionally set.

6 Claims, 4 Drawing Sheets

A/D CONVERSION APPARATUS

BACKGROUND OF THE INVENTION

The present invention relates to an A/D conversion apparatus for converting an analog input signal into a digital signal and, more particularly, to an A/D conversion apparatus to be incorporated in a microcomputer.

In recent years, with development of LSI technology, a microcomputer has been highly integrated, so that several kinds of peripheral hardware are mounted on a single chip. Particularly, in an A/D converter, which is indispensable in the fields of such as automobile control and AC servo control, the demand for the microcomputers incorporating the A/D converter has been greatly enhanced.

In a previously known microcomputer incorporating an A/D converter, which has a plurality of analog signal input terminals, generally, a scanning operation of successively A/D converting the plural analog input terminals is executed. For example, in the case where the A/D converter comprises four analog input terminals of $AN_0 \sim AN_3$, and four registers $REG_0 \sim REG_3$ for storing the result of the A/D conversion, an A/D conversion is successively conducted on the four terminals of $AN_0 \sim AN_3$ in the order of $AN_0 \rightarrow AN_1 \rightarrow AN_2 \rightarrow AN_3$, and the conversion results thus obtained are stored in the registers $REG_0 \sim REG_3$ corresponding to the input terminals $AN_0 \sim AN_3$, respectively. Upon completion of the A/D conversion for the $AN_0 \sim AN_3$, the A/D converter issues an interruption request signal to a central processing unit (hereinafter referred to as "CPU") within the microcomputer. When the CPU completes reading the conversion results from the $REG_0 \sim REG_3$, the A/D conversion is started again. Thereafter, the operation described above will be repeated.

However, the A/D converter described above has the following defects. The analog signals at the input terminals are successively A/D-converted through the scanning operation therefor in a fixed order, but their priority or their conversion order cannot be changed. In order to give a priority to a given input terminal or change the conversion order, an analog multiplexer or the like should be provided externally of the input terminals so that it changes the connections of the input terminals. This gives rise to an increase of the production costs.

Further, the A/D conversion of a certain analog input which is to be realized at a high speed may be kept waiting owing to the conversion of other analog input(s). This gives rise to inconveniences such as delay of control timings which leads to reduction of the performance of an application system.

SUMMARY OF THE INVENTION

It is, therefore, an object of the invention to overcome the problems existing in the conventional A/D conversion apparatus and to provide an improved A/D conversion apparatus.

It is another object of the invention to provide an A/D conversion apparatus which can optionally set the order of scanning terminals in the scanning operation for the A/D conversion for the terminals and also can improve the performance of an application system.

According to one aspect of the present invention, there is provided an A/D conversion apparatus which comprises:

an analog input selecting means for selecting one of a plurality of analog input terminals in accordance with an input terminal designating signal;

an A/D converter for A/D converting the analog value applied to the analog input terminal selected by the analog input selecting means into a digital value;

a plurality of registers for storing the conversion results in the A/D converter; and an operation control means for controlling the order of the A/D conversion by supplying the input terminal designating signal to the analog input selecting means in accordance with an A/D conversion order which can be optionally set.

In operation, an operation control means issues an input terminal designating signal to an analog input selecting means in accordance with an optionally designated A/D conversion order. Then, the analog input selecting means successively selects the analog input terminals in the designated order. The A/D converter performs A/D-conversion on the analog signal applied from the input terminal selected. In this way, the A/D conversion for the analog signals can be made in any priority, or the order of scanning the input terminals can be optionally set.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF THE PREFERRED EMBODIMENTS

Figure 1:
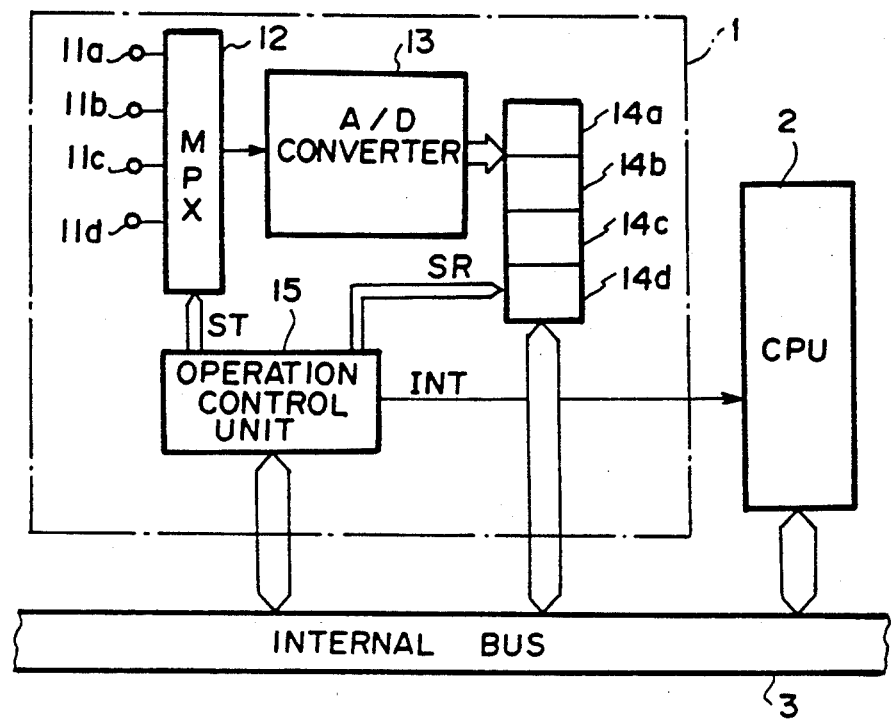
FIG. 1 is a block diagram of the microcomputer incorporating the A/D conversion apparatus of the first embodiment according to the invention.

Now, referring to the drawings, a detailed explanation will be given of the first and the second embodiment of the present invention.

FIG. 1 is a block diagram of the microcomputer incorporating the A/D conversion apparatus according to the first embodiment of the present invention.

The microcomputer is composed of an A/D conversion apparatus 1, a CPU 2 and an internal bus 3 for communicating data therebetween.

The CPU 2 serves to control the read and write of data for the A/D conversion apparatus 1 by executing an internal program, and also serves to receive an interruption signal INT from the A/D conversion apparatus 1.

The A/D conversion apparatus 1 is composed of a multiplexer 12 for selecting analog signals inputted from a plurality of input terminals 11a~11d, an A/D converter 13 for A/D-converting the output signal from the multiplexer 12, a plurality of registers 14a~14d for storing the conversion results from the A/D converter 13, and an operation control unit 15 for controlling the A/D conversion operation.

The multiplexer 12 selects one of the analog input terminals 11a~11d in accordance with an input terminal designating signal ST outputted from the operation control unit 15 and supplies the input analog signal thus selected to the A/D converter 13. The A/D converter 13 A/D-converts the analog signal outputted from the multiplexer 12 into a digital signal. The registers 14a~14d store the conversion result from the A/D converter 13 in the register designated by an address designating signal SR outputted from the operation control unit 15. The contents of any of the registers 14a~14d can be read under the control by the CPU 2.

Figure 2:
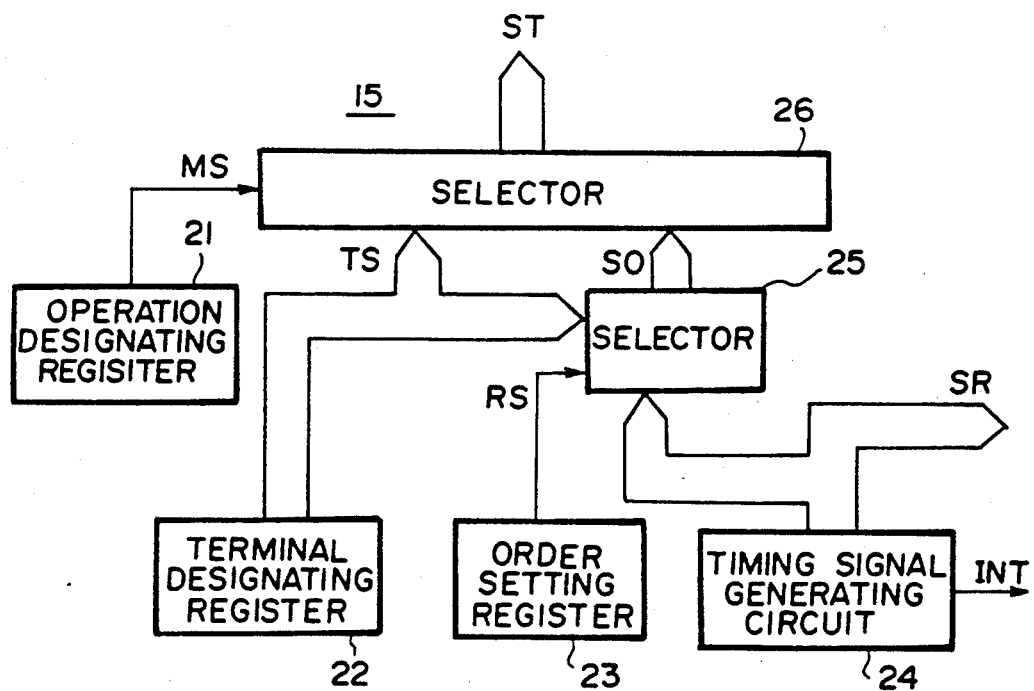
FIG. 2 is a block diagram of an operation control unit within the A/D conversion apparatus of FIG. 1.

The operation control unit 15 for controlling the A/D conversion operation has the arrangement as shown in FIG. 2. The operation control unit 15 comprises three registers, i.e., an operation designating register 21 for controlling the A/D conversion, a terminal designating register 22 for designating the input terminal to be converted and an order setting register 23 for designating the order of the A/D conversion. These operation designating register 21, terminal designating register 22 and conversion order setting register 23 are adapted to be accessible from the CPU 2.

The operation control unit 15 further comprises two selectors 25 and 26 and a timing signal generating circuit 24.

The selector 26 is a four-bit selector which selectively generates, as an input terminal designating signal ST, the value TS set in the terminal designating register 22 if the value MS set in the operation designating register 21 is "0", and generates the output SO from the selector 25 if the value MS set in the operation designating register is "1".

Figure 3:
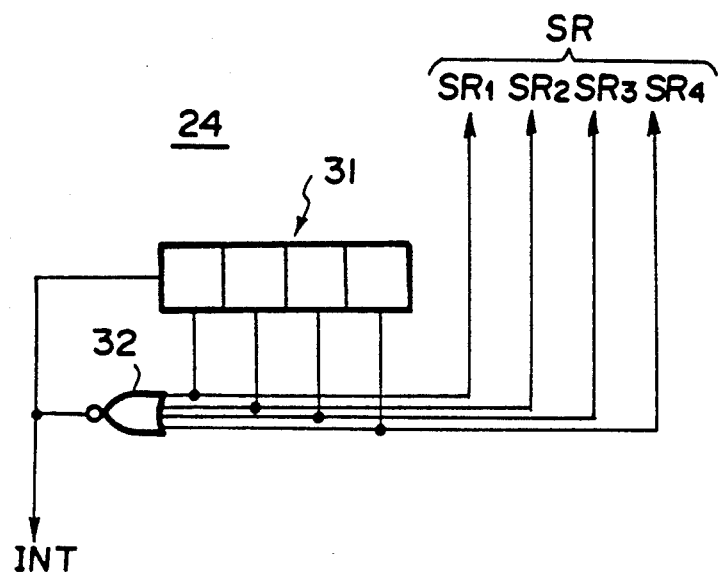
FIG. 3 is a block diagram of a timing signal generating circuit within the operation control unit of FIG. 2.

The timing signal generating circuit 24 is constituted by, for example, a ring counter as shown in FIG. 3. In FIG. 3, respective bit outputs from a four-bit shift register 31 are inputted to an NOR gate 32. The output from the NOR gate 32 is inputted to the shift register 31 and also outputted as an interruption signal INT. Further, the respective bit outputs from the shift register 31 are outputted as addressing signal SR.

Figure 4:
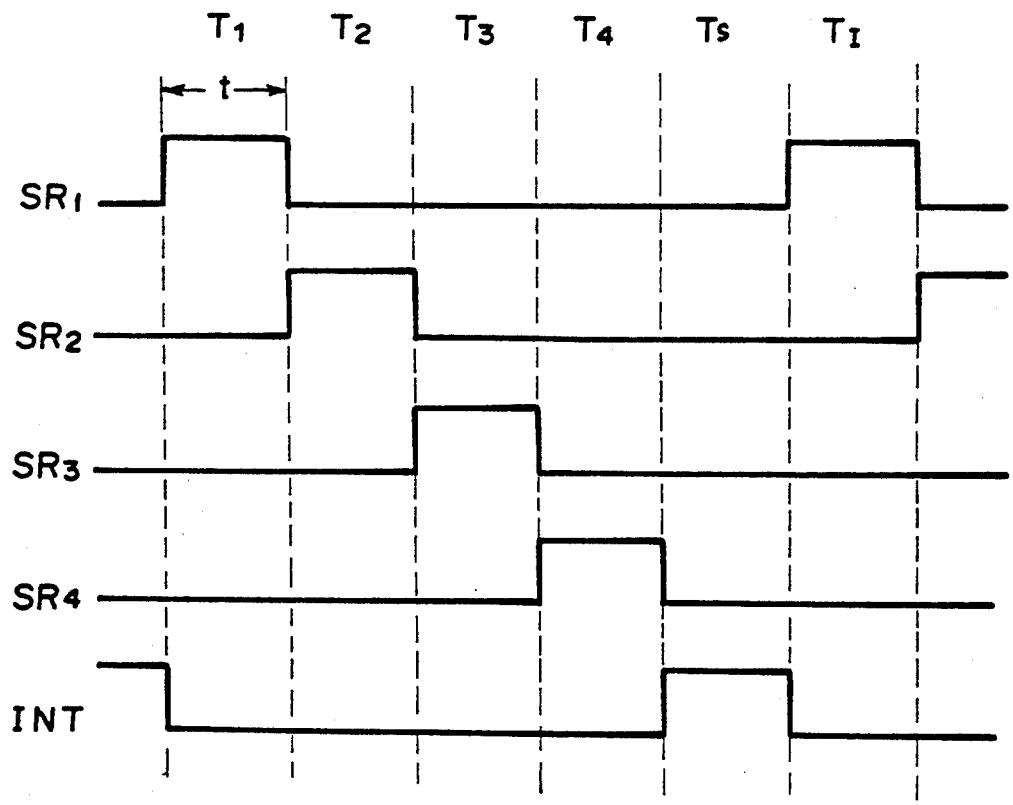
FIG. 4 is a waveform chart of an output waveform of the timing signal generating circuit of FIG. 3.

The timing signal generating circuit 24 successively generates timing signals at the timings as shown in FIG. 4. The interruption signal INT is given by the NOR logic of the respective bit data from the shift register 31 so that, if all the bit data from the shift register 31 are "0", "1" will be outputted. Specifically, in the timing signal generating circuit 24, only one of the respective bit outputs $SR_1$, $SR_2$, $SR_3$ and $SR_4$ from the shift register 31 and the interruption signal INT is "1", and all the remaining bits are "0". Now it is assumed that the timings when the data $SR_1$, $SR_2$, $SR_3$, $SR_4$ and the interruption signal INT are "1" are $T_1$, $T_2$, $T_3$, $T_4$ and $T_5$, respectively. The data $SR_1 \sim SR_4$ which are four bits constitute the addressing signal SR.

Figure 5:
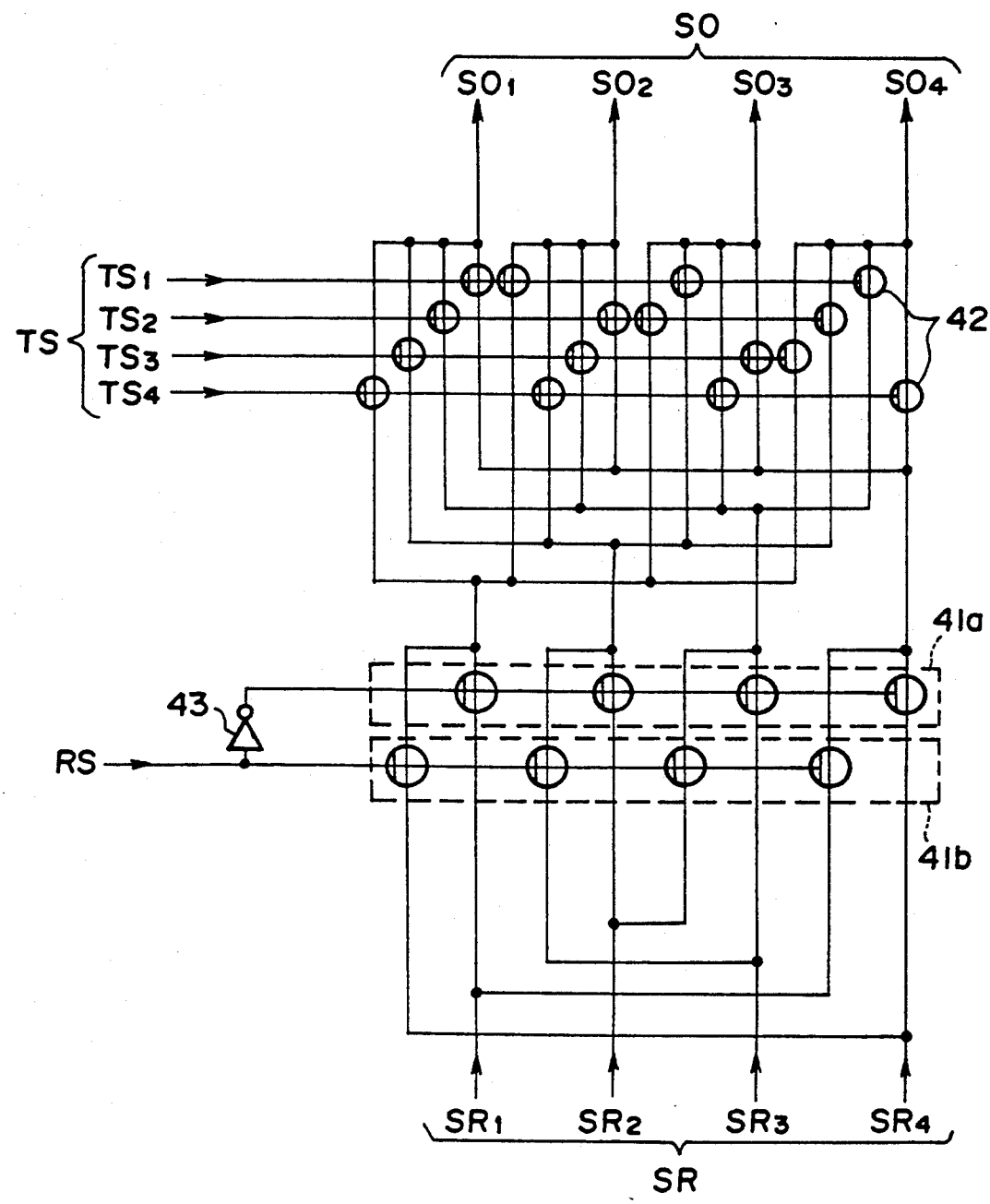
FIG. 5 is a block diagram of a selector within the operation control unit of FIG. 2.

The selector 25, as shown in FIG. 5, is composed of an inverter 43 for inverting the RS signal; switches 41a, 41b for setting the order of outputting data on the basis of the RS signal and the output from the inverter; and switches 42 for selecting bit data $SO_1 \sim SO_4$ of the output signal SO to be connected with the respective bit data $SR_1 \sim SR_4$ of the addressing signal SR on the basis of the control signal TS.

Specifically, on the basis of the TS value set in the terminal designating register 22 and the RS value set in the order setting register 23, the selector 25 selects the bit data of the output signal SO to be connected with the bit data $SR_1 \sim SR_4$ of the addressing signal SR. The addressing signal SR is produced in the form of successive bit data $SR_1 \sim SR_4$ at the timings of $T_1 \sim T_4$. Therefore, the value of RS set in the order setting register 23 causes one of the switches 41a and 41b to be conductive so that the outputting order of the output signal SO, i.e., ascending order ($SO_1 \rightarrow SO_2 \rightarrow SO_3 \rightarrow SO_4$) or descending order ($SO_4 \rightarrow SO_2 \rightarrow SO_1$) is determined. Further, the value TS set in the terminal designating register 22 determines the timings of bit data $SO_1 \sim SO_4$ between which the timing of Ts is to be taken. The timing Ts is a timing when the interruption signal INT is issued to the CPU 2 and the CPU 2 reads out the data from the registers 14a~14d. The addressing signal SR is composed of bit data $SR_1 \sim SR_4$ successively outputted at the timings $T_1 \sim T_4$, so that registers 14a~14d store the A/D conversion results in the order starting from the register 14a.

An explanation will be given of the operation of the microcomputer incorporating the A/D conversion apparatus constructed as described above. Now it is assumed that the A/D conversion apparatus 1 includes two modes, that is, one mode of continuously A/D-converting the signal for a certain analog input terminal (referred to as "SELECT" mode) and the other mode of successively A/D-converting the signals for plural input terminals (referred to as "SCAN" mode).

In executing the SELECT mode, the CPU 2 sets "1" in the operation designating register 21, and in executing the SCAN mode, the CPU 2 sets "0" in the operation designating register 21.

The terminal designating register 22 designates the input terminal for which the A/D conversion is to be made in the SELECT mode, and that for which the A/D conversion is to be started in the SCAN mode, i.e., the timing when the conversion result is to be read. The order setting register 23 designates the order of the input terminals for which the A/D conversion is to be made, i.e., the ascending order (11a→11b→11c→11d) or the descending order (11d→11c→11b→11a).

Next, an explanation will be given of the A/D conversion operation in the respective modes.

(1) "SELECT" mode wherein "0" is set in the operation designating register 21

The A/D conversion apparatus 1 continues to A/D-convert the signal for a single analog input terminal designated by the terminal designating register 22. The A/D conversion result is stored in the register corresponding to the analog input terminal (for example, the register 14a if the designated analog input terminal is 11a). The interruption signal INT becomes active ("1") whenever four times A/C conversions have been completed. Thus, the A/D conversion results in the registers 14a~14d are taken in the CPU 2. The operation described above will be repeated.

(2) "SCAN" mode wherein "1" is set in the operation designating register 21.

The A/D conversion apparatus 1 will successively A/D-convert the signals at all the analog input terminals. In this case, the scan operation is started from the input terminal designated by the terminal designating register 22 and thereafter the A/D conversion is performed in the terminal order designated by the order setting register 23. Namely, the terminal designating register 21 designates the first input terminal for which the A/D conversion is to be made and the order setting register 23 sets the terminal order of the A/D conversion for the ascending order or descending order.

For example, if "3" is set in the terminal designating register 22 and "1" is set in the order setting register 23, the analog level at the analog input terminal 11d will be A/D converted, and the conversion result will be stored in the register 14d. Likewise, the A/D conversion will be performed in the descending order of the analog input terminals 11d→11c→11b→11a. Upon completion of the A/D conversion for the input terminal 11a, the interruption signal INT will be made active ("1"). Thereafter, the A/D conversion is started again from the analog input terminal 11d to repeat the above operation.

Examples of the operation based on the combinations of the values set in the operation designating register 21, the terminal designating register 22 and the order setting register 23 are shown in Table 1.

registers 61a~61d are selected in accordance with the output SR from the timing signal generating circuit 24 and such data are A/D converted in such a manner that the data applied to the analog input terminals designated by the conversion terminal registers 61a, 61b, 61c and 61d are A/D-converted at the timings $T_1$, $T_2$, $T_3$ and $T_4$, respectively. In this case, the output SR from the timing signal generating circuti 24 is also an address signal line for selecting the registers 14a~14d storing the conversion results, so that the conversion results will be stored in the registers 14a~14d in the order of the values A/D converted.

The operation of the entire A/D conversion apparatus according to this second embodiment will be explained below.

The basic operation is not explained here since it is the same as in the first embodiment. In the SCAN mode, the scan operation will be performed in accordance with the values specified by the conversion terminal designating registers 61a~61d within the order setting circuit 51.

For example, if "0010", "1000", "0001" and "0100" are set in the ocnversion terminal designating registers

TABLE 1

| OPERATION DESIGNATING REGISTER 21 | TERMINAL DESIGNATING REGISTER 22 | ORDER SETTING REGISTER 23 | OPERATION |
|---|---|---|---|
| 0 | 3 | x | CONVERSION OF THE ANALOG VALUE APPLIED TO THE INPUT TERMINAL 11d IS REPEATED (SELECT MODE) |
| 0 | 1 | x | CONVERSION OF THE ANALOG VALUE APPLIED TO THE INPUT TERMINAL 11d IS REPEATED (SELECT MODE) |
| 1 | 2 | 0 | CONVERSION IS SUCCESSFULLY PERFORMED IN THE ASCENDING ORDER OF THE INPUT TERMINALS 11c → 11d → 11a → 11b (SCAN MODE) |
| 1 | 1 | 0 | CONVERSION IS SUCCESSFULLY PERFORMED IN THE DESCENDING ORDER OF THE INPUT TERMINALS 11b → 11c → 11d → 11a (SCAN MODE) |
| 1 | 1 | 1 | CONVERSION IS SUCCESSFULLY PERFORMED IN THE DESCENDING ORDER OF THE INPUT TERMINALS 11b → 11a → 11d → 11c (SCAN MODE) |
| 1 | 3 | 1 | CONVERSION IS SUCCESSFULLY PERFORMED IN THE DESCENDING ORDER OF THE INPUT TERMINALS 11d → 11c → 11b → 11a (SCAN MODE) | x — INDEFINITE

Figure 6:
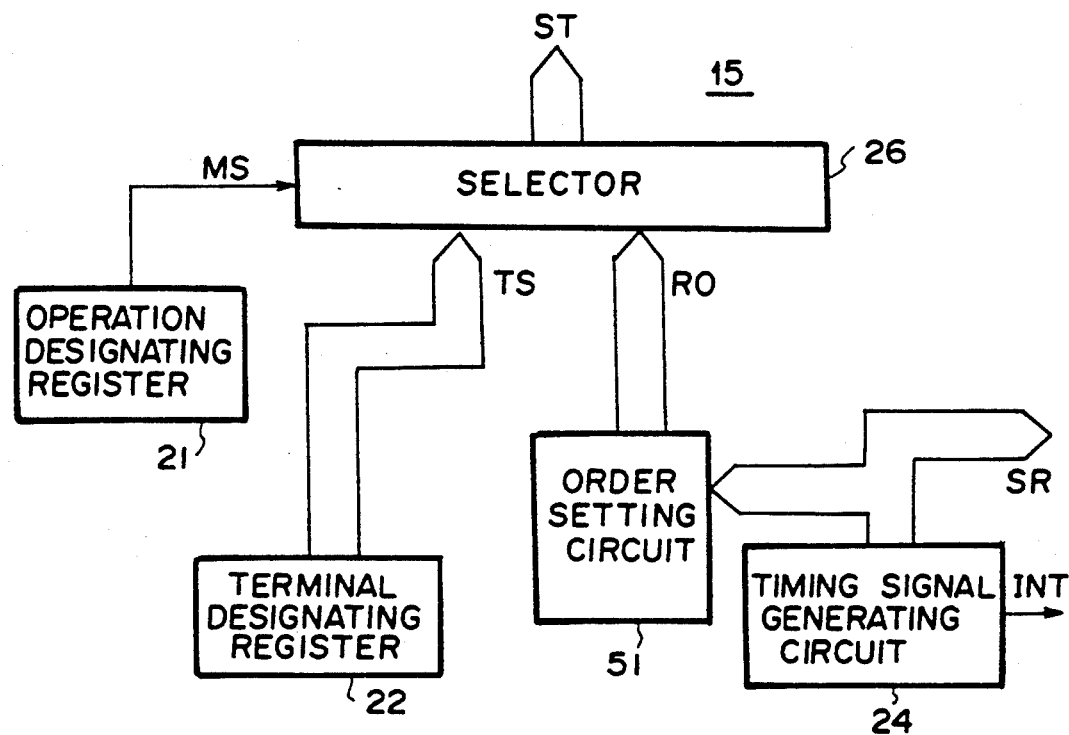
FIG. 6 is a block diagram of an operation control unit within the A/D conversion apparatus of the second embodiment according to the invention.

Now, referring to FIGS. 6 and 7, an explanation will be given of the A/D conversion apparatus of a second embodiment according to the present invention. FIG. 6 is a block diagram of an arrangement of the operation control unit 15 within the A/D conversion apparatus according to the second embodiment. In FIG. 6, like reference numerals refer to like parts in FIG. 2. The operation control unit 15 in this embodiment is different from that in the first embodiment only in that an order setting circuit 51 is newly provided instead of the order setting register 23 and the selector 25.

Figure 7:
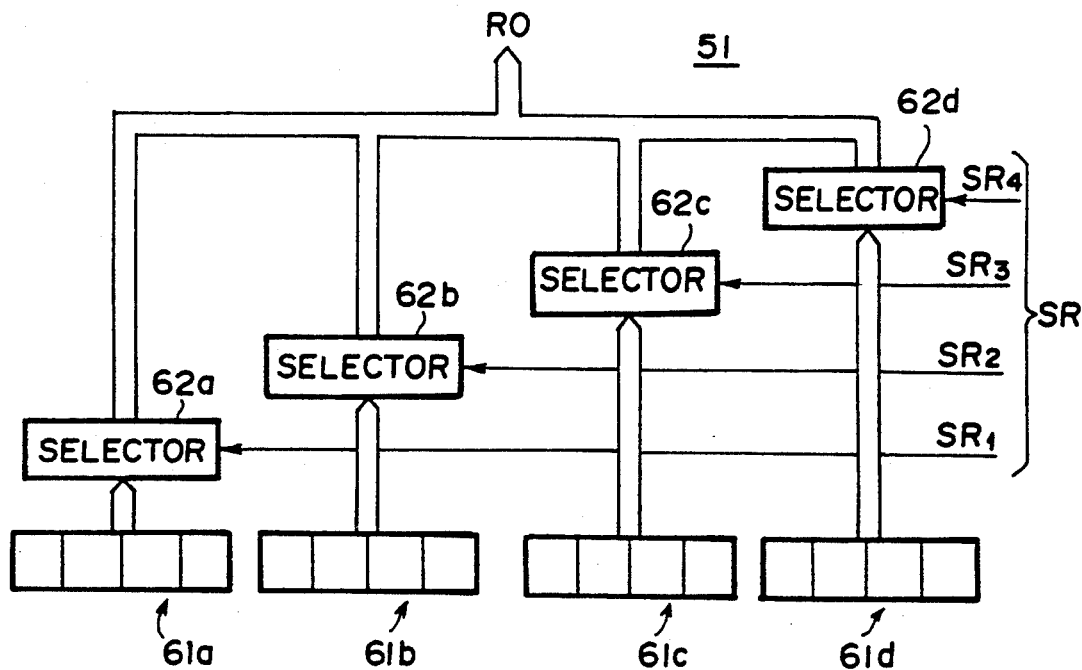
FIG. 7 is a block diagram of an order setting circuit within the operation control unit of FIG. 6.

The order setting circuit 51, as shown in FIG. 7, is composed of four conversion terminal designating registers 61a~61d and selectors 62a~62d for selecting the outputs from these registers. Each of the conversion terminal designating registers 61a~61d is a four-bit register; one of the four bits is set for a high level ("1"). The position of the high level located indicates the analog input terminal the analog value for which is to be A-D converted. Specifically, the data for the input terminals set in the conversion terminal designating 61a, 61b, 61c and 61d, respectively, the analog values applied to the analog input terminals 11a~11d will be successively A/D-converted in the order of 11b→11d→11a→11c. Upon completion of the A/D conversion for the input terminal 11c, the interruption request signal INT will be made active ("1"). Thereafter, the A/D conversion will be started from the terminal 11b to repeat the operation described above.

In accordance with this second embodiment, the order of scanning the input terminals in the scan mode can be optionally set.

Additionally, although the conversion terminal designating registers 61a~61 are constituted by a four-bit register in this embodiment, they may be constituted by a two-bit register and the values of two bits may be encoded to designate the terminal to be A/D converted.

In accordance with the present invention, when the operation control means supplies an input terminal designating signal to the analog input selecting means in accordance with the designated A/D conversion order, the analog input selecting means successively selects the analog input terminals in the designated order. Therefore, by optionally setting the A/D conversion order in the operation control means, the A/D conversion can be performed with a certain priority or the order of scanning the terminals can be changed. If the A/D conversion apparatus is applied to a microcomputer sustem, its performance can be greatly improved.

While the invention has been described in its preferred embodiments, it is to be understood that the words which have been used are words of description rather than limitation and that changes within the purview of the appended claims may be made without departing from the true scope and sprit of the invention in its broader aspects.

What is claimed:

1. An A/D conversion apparatus comprising:
   an analog input terminal selecting means for selecting one of a plurality of analog input terminals in accordance with an input terminal designating signal;
   an A/D converter for A/D converting an analog value applied to the analog input terminal selected by said analog input terminal selecting means into a digital value;
   a plurality of registers for storing conversion results from said A/D converter; and
   an operation control means for controlling an order of the A/D conversion by supplying said input terminal designating signal to said analog input terminal selecting means in accordance with an A/D conversion order which can be optionally set,
   wherein said operation control means comprises:
   an operation designating register for designating an A/D conversion mode;
   a terminal designating register for designating the input terminal to be converted;
   an order setting register for designating the order of the A/D conversion;
   a timing signal generation circuit for generating timing signals to be used as bit data of an addressing signal and an interruption request signal;
   a first selector for selecting bit data of an output signal thereof to be connected with the bit data of the addressing signal in accordance with a value set in said terminal designating register and said order setting register, respectively; and
   a second selector for generating, as said input terminal designating signal, the value set in said terminal designating register or the output from said first selector.

2. An A/D conversion apparatus according to claim 1, wherein said operation designating register, said terminal designating and said order setting register are accessible from a central processing unit.

3. An A/D conversion apparatus according to claim 1, wherein said first selector comprises switches for setting an ascending of descending order of outputting bit data of outputs thereof in accordance with a value set in said order setting register, and another switch for selecting the bit data of the output from said first selector to be connected with bit data of the addressing signal in accordance with the value set in said terminal designating register.

4. An A/D conversion apparatus according to claim 1, wherein said operation designating register sets a select mode continuing to execute the A/D conversion for one analog input terminal and a scan mode successively executing the A/D conversion for plural analog input terminals.

5. An A/D conversion apparatus comprising:
   an analog input terminal selecting means for selecting one of a plurality of analog input terminals in accordance with an input terminal designating signal;
   an A/D converter for A/D converting an analog value applied to the analog input terminal selected by said analog input selecting means into a digital value;
   a plurality of registers for storing conversion results from said A/D converter; and
   an operation control means for controlling an order of the A/D conversion by supplying said input terminal designating signal to said analog input terminal selecting means in accordance with an A/D conversion order which can be optionally set,
   wherein said operation control means comprises:
   an operation designating register for designating an A/D conversion mode;
   a terminal designating register for designating the input terminal to be converted;
   an order setting circuit for optionally designating an order of the A/D conversion for the analog input terminals;
   a timing signal generation circuit for generating timing signals to be used as a bit data of an addressing signal and an interruption request signal; and
   a selector for generating, as said input terminal designating signal, a value set in said terminal designating register or an output from said order setting circuit.

6. An A/D conversion apparatus according to claim 5, wherein said order setting circuit comprising a plurality of registers for designating the input terminal to be A/D converted and a plurality of selectors for selecting the outputs from these registers.

* * * * *